United States Patent
Chen

(10) Patent No.: US 9,515,490 B2
(45) Date of Patent: Dec. 6, 2016

(54) POWER MANAGEMENT METHOD AND POWER MANAGEMENT SYSTEM UTILIZING A MEASURE OF A DRIVING CURRENT TO CONTROL AN ELECTRONIC MODULE

(71) Applicant: Pegatron Corporation, Taipei (TW)

(72) Inventor: Ying-Ying Chen, Taipei (TW)

(73) Assignee: PEGATRON CORPORATION, Taipei (TW)

( * ) Notice: Subject to any disclaimer, the term of this patent is extended or adjusted under 35 U.S.C. 154(b) by 714 days.

(21) Appl. No.: 14/016,294

(22) Filed: Sep. 3, 2013

(65) Prior Publication Data

US 2014/0062193 A1 Mar. 6, 2014

(30) Foreign Application Priority Data

Sep. 4, 2012 (TW) .............................. 101132212 A

(51) Int. Cl.
| | |
|---|---|
| H02J 3/14 | (2006.01) |
| H02J 4/00 | (2006.01) |
| G05F 1/10 | (2006.01) |
| G01R 19/165 | (2006.01) |
| H02J 9/00 | (2006.01) |

(52) U.S. Cl.
CPC ........... *H02J 4/00* (2013.01); *G01R 19/16528* (2013.01); *G05F 1/10* (2013.01); *H02J 3/14* (2013.01); *H02J 9/005* (2013.01); *Y10T 307/406* (2015.04)

(58) Field of Classification Search
CPC ............ H02M 3/335; H02J 3/14; H02J 4/00; G01R 19/16528
USPC ................. 307/31, 38; 700/291; 318/400, 3; 363/79; 323/234
See application file for complete search history.

(56) References Cited

U.S. PATENT DOCUMENTS

| | | | | |
|---|---|---|---|---|
| 8,890,505 | B2 * | 11/2014 | Forbes, Jr. ............. | G06Q 10/00 323/299 |
| 2010/0019837 | A1 * | 1/2010 | Rozen ................... | G06F 1/3203 327/544 |
| 2010/0148708 | A1 * | 6/2010 | Jorgenson ............. | G11B 19/28 318/400.3 |
| 2011/0242802 | A1 * | 10/2011 | Work ....................... | H02J 7/35 362/183 |
| 2016/0202741 | A1 * | 7/2016 | Van Der Lee .......... | G06F 1/206 713/300 |

* cited by examiner

*Primary Examiner* — Arnold Kinkead
(74) *Attorney, Agent, or Firm* — McClure, Qualey & Rodack, LLP

(57) ABSTRACT

A power management method utilizes the steps of reading the driving current; determining if a driving current of an electronic device is less than or equal to a first steady current value for a first period of time; turning off a first electronic module to decrease the driving current when the driving current is less than or equal to the first steady current value for the first period of time; determining if the driving current is within a first judging range for a second period of time; updating the first steady current value with a second steady current value when the driving current is within the first judging range for the second period of time; and determining if the second steady current value is less than or equal to an energy saving set value.

10 Claims, 4 Drawing Sheets

POWER MANAGEMENT METHOD AND POWER MANAGEMENT SYSTEM UTILIZING A MEASURE OF A DRIVING CURRENT TO CONTROL AN ELECTRONIC MODULE

BACKGROUND

1. Technology Field

The present invention generally relates to a power management method and a power management system; particularly, the present invention relates to a power management method and a power management system which can detect a current of a system and control the electric quantity of the system according to a current status.

2. Description of the Related Art

A variety of electronic devices change the habit in modern life. For example, cell phones facilitate the communication for people; laptops provide better mobility and performance for business people; all kinds of files can be managed by home PCs; tablet computers have advantages of slim and multitasking to enrich life.

Take conventional tablet computers as an example, which have a plurality of modules and can execute a plurality of functions simultaneously. In addition, the quantity of electricity of the conventional tablet computers is finite, and the quantity of electricity is often not enough under long-time using. In practical applications, in order to maintain the endurance of the battery, the conventional tablet computers utilize operating systems or specific hardware modules to monitor energy saving process. However, once the operating systems suffer unexpected crash or the hardware modules suffer accidents, the monitor process of energy saving will be terminated.

In addition, although the conventional computers have sleeping functions to save power, the sleeping function is activated according to an idle time of the system and is easily forced to turn off the modules which are operating, and the conventional tablet computers cannot activate the sleeping function according to the operating status of the system and the modules.

For the above reasons, how to design an energy saving mechanism which can decrease loading of the system and effectively save the power becomes an important issue.

SUMMARY

The present invention provides a power management method and a power management system which can detect a current of the system and control electric quantity according to the current status.

In one embodiment, a power management method of the present invention for an electronic device that is operated with a driving current includes: (a) reading the driving current; (b) determining if the driving current is less than or equal to a first steady current value for a first period of time, wherein the first steady current value is an initial current set value; (c) turning off a first electronic module of the electronic device to decrease the driving current when the driving current is less than or equal to the first steady current value for the first period of time, wherein the first electronic module corresponds to a first current variation parameter; (d) determining if the driving current is within a first judging range for a second period of time, wherein a maximum value of the first judging range is a sum of the first steady current value and the first current variation parameter, and a minimum value of the first judging range is a difference between the first steady current value and the first current variation parameter; (e) updating the first steady current value with a second steady current value when the driving current is within the first judging range for the second period of time, wherein the second steady current value is a difference between the first steady current value and the first current variation parameter; (f) determining if the second steady current value is less than or equal to an energy saving set value; and (g) activating an energy saving mode when the second steady current value is less than or equal to the energy saving set value.

In another embodiment, a power management system of the present invention is used for managing a power of an electronic device which has at least one electronic module and is operated with a driving current. In an embodiment, the power management system includes a detecting module, a comparison module, and a control module, wherein the detecting module is connected with the electronic device and reading the driving current. In addition, the comparison module is connected with the detecting module and stores a first steady current value and a first current variation parameter, wherein the detecting module transmits the driving current to the comparison module, and the comparison module compares the driving current with the first steady current value and determines if the driving current is within a first judging range. It is noted that a maximum value of the first judging range is a sum of the first steady current value and the first current variation parameter, and a minimum value of the first judging range is a difference between the first steady current value and the first current variation parameter.

In practical applications, the control module is connected with the detecting module and the comparison module, wherein the comparison module transmits an activation signal to the control module; the control module, according to the activation signal, drives the electronic device to turn off a first electronic module to decrease the driving current when the driving current is less than or equal to the first steady current value for a first period of time, wherein the first electronic module corresponds to the first current variation parameter.

In comparison with prior arts, the power management method and the power management system of the present invention utilize the first steady current value to determine whether to turn off the first electronic module. Furthermore, the power management method of the present invention determines whether the electronic device is at the idle status by reading the driving current of the electronic device, further determining whether to drive the electronic device into the energy saving status so as to save the power.

The above and other objects, features and advantages of the present invention will be more clearly understood from the following detailed description taken in conjunction with the accompanying drawings.

DETAILED DESCRIPTION OF THE PREFERRED EMBODIMENT

According to one embodiment, the present invention provides a power management method, which can save a power resource of an electronic device. In the embodiment, the power management method can be implemented to the electronic device by a power management system and manages a power of the electronic device by the power management system. In practical applications, the electronic device can be a tablet computer, a laptop, a home computer, or an electronic communication device, but not limited to the embodiment.

Figure 1:
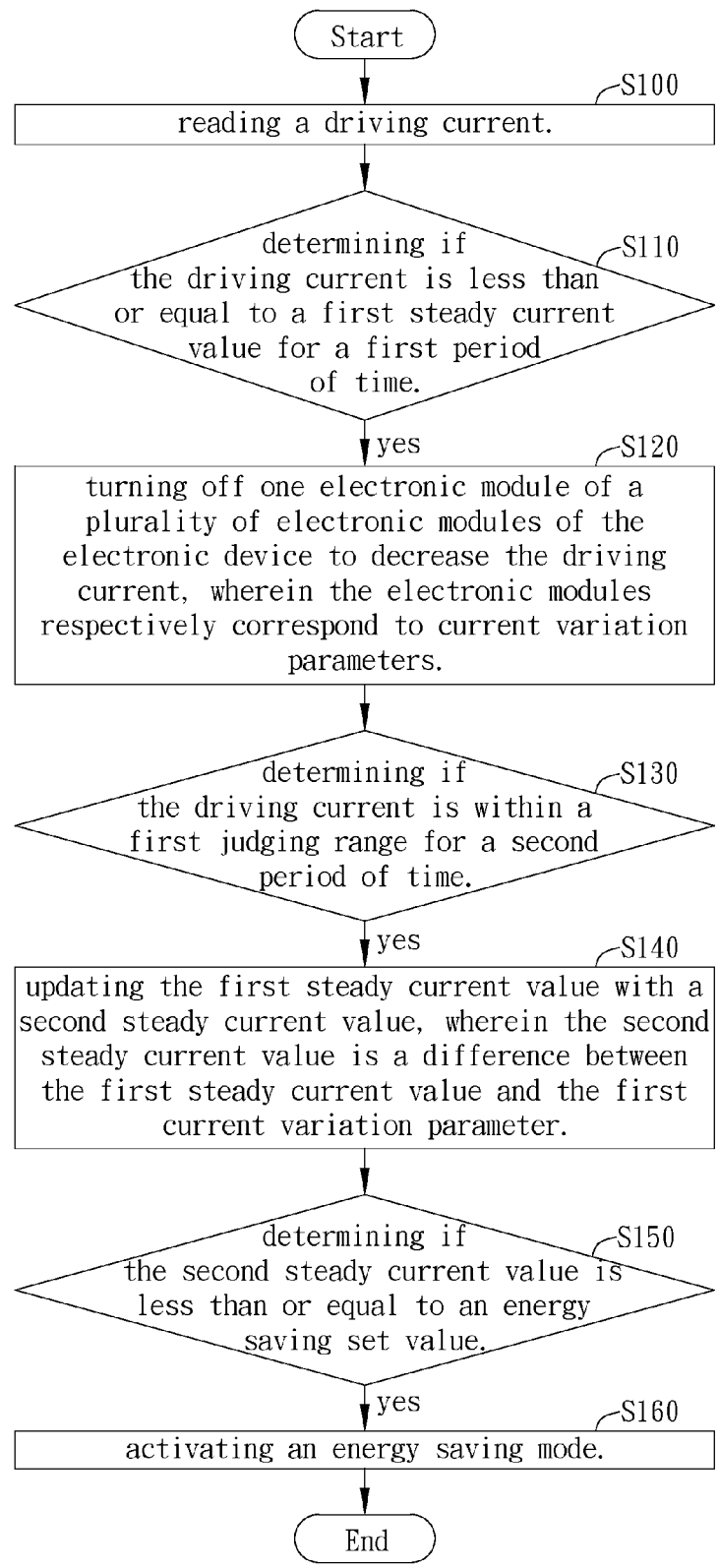
FIG. 1 is a flowchart of an embodiment of a power management method of the present invention.

Please refer to FIG. 1; FIG. 1 is a flowchart of an embodiment of a power management method of the present invention. As shown in FIG. 1, the power management method firstly executes a step S100 including: reading a driving current. For example, the electronic device has at least one electronic module and is operated with the driving current. In other words, the driving current is a current value which drives the electronic device and drives the at least one electronic to operate. In practical applications, the electronic modules have various sorts and can be electronic storage modules, electronic input/output modules, or electronic communication modules. After the step S100, the power management method executes a step S110 including: determining if the driving current is less than or equal to a first steady current value for a first period of time. It is noted that the first steady current value is an initial current set value, and the first steady current value is related to a current value of the electronic device at a steady status. The power management method determines a driving status of the electronic device according to the first steady current value.

If the determining result of the step S110 is "YES", the power management method executes a step S120 including: turning off one electronic module of a plurality of electronic modules of the electronic device to decrease the driving current, wherein the electronic modules respectively correspond to current variation parameters. The power management method, then, executes a step S130 including: determining if the driving current is within a first judging range for a second period of time. It is noted that a maximum value of the first judging range is a sum of the first steady current value and the first current variation parameter, and a minimum value of the first judging range is a difference between the first steady current value and the first current variation parameter. In addition, the second period of time can be 5 minutes, but is not limited to the embodiment. If the determining result of the step S130 is "YES", the power management method executes a step S140 including: updating the first steady current value with a second steady current value, wherein the second steady current value is a difference between the first steady current value and the first current variation parameter, and a step S150 including: determining if the second steady current value is less than or equal to an energy saving set value. If the determining result of the step S150 is "YES", the power management method executes a step S160 including: activating an energy saving mode. If the second steady current value is larger than the energy saving set value, the power management method executes the step S120 to turn off one electronic module of the electronic modules of the electronic device to decrease the driving current, and continues to executes the following steps until the second steady current value is less than or equal to the energy saving set value.

It is noted that the first judging range is related to the current variation parameter corresponding to the turned-off electronic module, and the method determines the driving status of the electronic module according to the relation between the first steady current value and the driving current. If the driving current is less than or equal to the first steady current value for the first period of time, the method executes the step S120. Additionally, the power management method activates the energy saving mode when determining the second steady current value is less than or equal to the energy saving set value. In practical applications, the energy saving mode can be a sleep mode, but is not limited to the embodiment.

Figure 2:
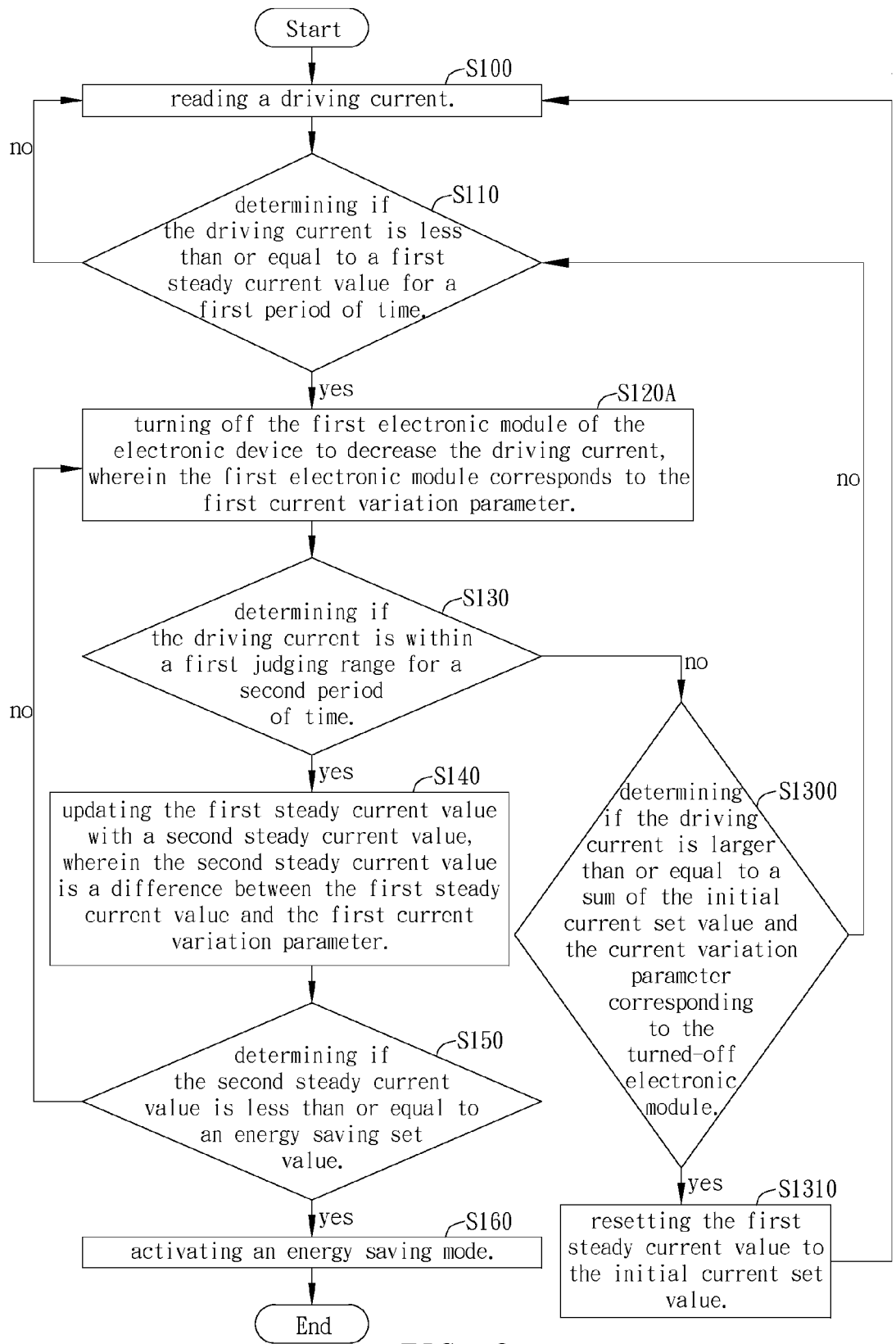
FIG. 2 is a detailed flowchart of the embodiment of FIG. 1 of the present invention.
Figure 3:
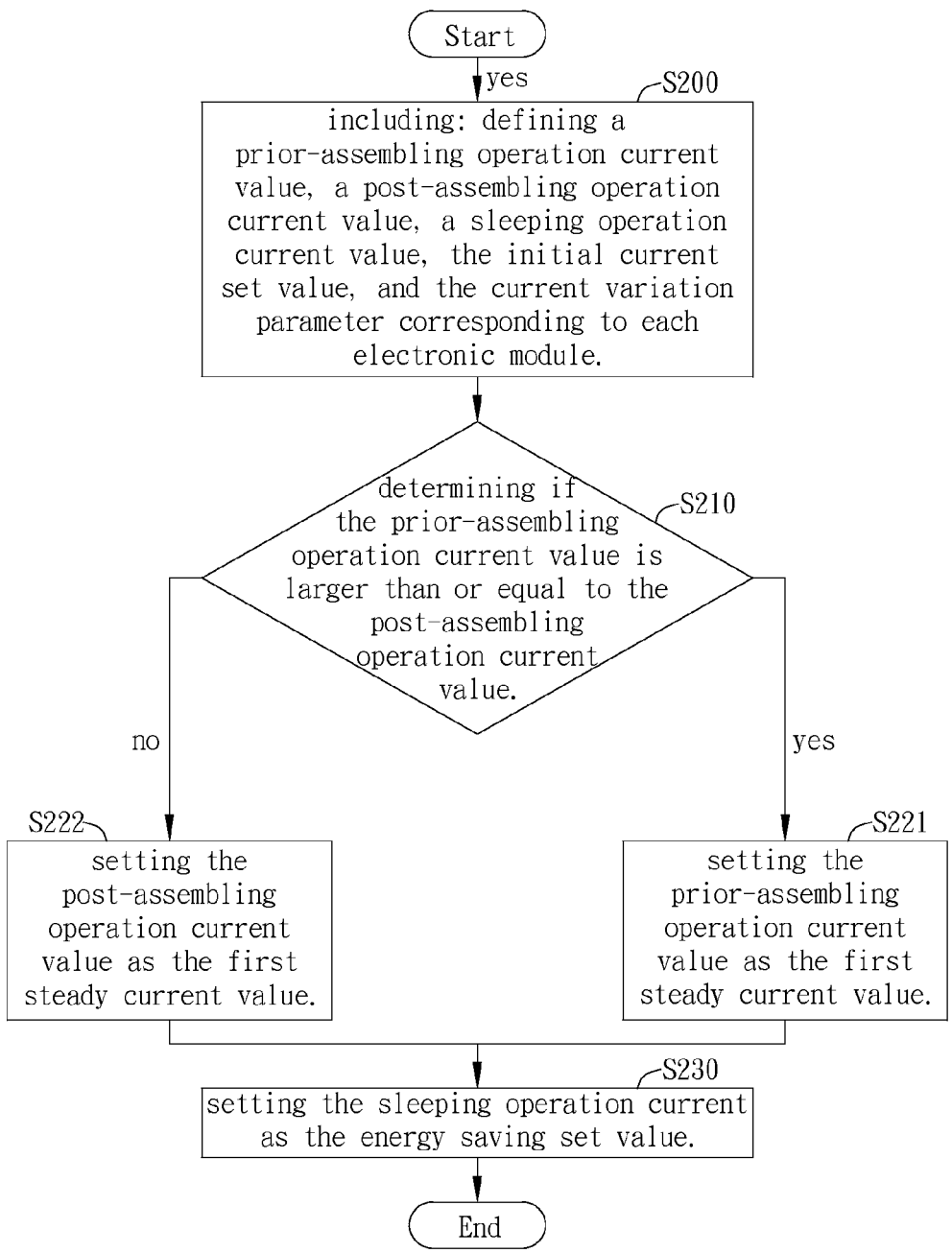
FIG. 3 is a flowchart of an embodiment of setting a preset value of the power management method of the present invention.

Further illustrate the embodiment of FIG. 1 of the present invention. Please refer to FIG. 2; FIG. 2 is a detailed flowchart of the embodiment of FIG. 1 of the present invention. As shown in FIGS. 1 and 2, the power management method, firstly, executes the step S100 including: reading a driving current. The method, secondly, executes the step S110 including: determining if the driving current is less than or equal to a first steady current value for a first period of time. Please refer to FIG. 3; FIG. 3 is a flowchart of an embodiment of setting a preset value of the power management method of the present invention. As shown in FIG. 3, the power management method executes a step S200 including: defining a prior-assembling operation current value, a post-assembling operation current value, a sleeping operation current value, the initial current set value, and the current variation parameter corresponding to each electronic module.

In practical applications, the prior-assembling operation current value is a lowest steady current which the electronic device, at a bare board status or before assembling, connects at least one electronic module to operate with; the post-assembling operation current value is a lowest steady current which the electronic device, after assembling, connects at least one electronic module to operate with. In addition, the sleeping operation current value is a lowest required current which the electronic device, after entering the sleep mode, drives at least one electronic module to be terminated with. It is noted that each electronic module corresponds to the current variation parameter, wherein the current variation parameter of each electronic module can be the same or different. The amplitude of the current variation parameter is determined according to a current variation of each electronic module at idle status.

In addition, the method shown in FIG. 3 executes a step S210 including: determining if the prior-assembling operation current value is larger than or equal to the post-assembling operation current value. If the determining result of the step S210 is "YES", the method executes a step S221 including: setting the prior-assembling operation current value as the first steady current value. If the determining result of the step S210 is "NO", the method executes a step S222 including: setting the post-assembling operation current value as the first steady current value. In other words, the power management method selects a bigger one between the prior-assembling operation current value and the post-assembling operation current value as the first steady current value. For instance, if the prior-assembling operation current value is 1142 mA and the post-assembling operation current value is 1100 mA, the first steady current value is 1142 mA. In addition, the prior-assembling operation current value and the post-assembling operation current value are current values which all of the electronic modules of the electronic device are activated to be at the idle status with.

In addition, in the step S110 of FIG. 2, the power management method utilizes the first period of time to compare the relative amplitude between the driving current and the first steady current value, wherein the first period of time can be 3 minutes, but not limited to the embodiment. If the driving current maintains to be less than or equal to the first steady current value for 3 minutes, the power management method executes the step S120/S120A. However, if the driving current is not less than or equal to the first steady current value for 3 minutes, the power management method executes the step S100. In other words, the power management method utilizes the comparison between the first steady current value and the driving current to determine if the electronic modules of the electronic device are at the idle status so as to execute the command of energy saving.

As shown in FIG. 2, when the driving current is less than or equal to the first steady current value for 3 minutes, the power management method executes a step S120A including: turning off the first electronic module of the electronic device to decrease the driving current, wherein the first electronic module corresponds to the first current variation parameter. It is noted that the step S120A is an embodiment of the step S120, wherein the first electronic module is one of the electronic modules, and the power management method turns off the first electronic module to decrease the driving current. In the present process, the electronic modules are classified according to the functions; the electronic device has at least one electronic storage module, at least one electronic input/output module, and at least one electronic communication module. It is noted that the power management method sequentially turns off the electronic modules in an order of the electronic storage module, the electronic input/output module, and the electronic communication module. In other words, the power management method prioritizes to turn off the electronic storage module, secondly turns off the electronic input/output module, and then turns off the electronic communication module, but not limited to the embodiment.

In addition, each electronic module corresponds to the current variation parameter, and the power management method prioritizes to turn off the electronic module having less current variation parameter among the electronic modules in each function class. For instance, one class of the electronic modules is the electronic input/output module, and the electronic input/output modules include an electronic audio module and an electronic touch module, wherein the current variation parameters corresponding to the electronic audio module and the electronic touch module are respectively 3 mA and 2 mA, but not limited to the embodiment. In the process, the power management method prioritizes to turn off the electronic touch module in this class to decrease the driving current.

It is noted that the power management method determines that the electronic modules are operated at the activating status or at the idle status by detecting the current variation of the electronic device, and turns off the idle electronic module so as to save the power intelligently. Furthermore, the power management method, without utilizing hardware or other components to execute the determination of the energy saving, further determines whether to turn off the first electronic module by the first steady current value to decrease the driving current so as to increase the energy saving efficiency and decrease the system loading of the electronic device.

After the step S120A, the power management method executes the step S130 including: determining if the driving current is within a first judging range for a second period of time. It is noted that the maximum value of the first judging range is the sum of the first steady current value and the first current variation parameter, and the minimum value of the first judging range is the difference between the first steady current value and the first current variation parameter. In the process, the first steady current value is 1142 mA and the first current variation parameter is 2 mA, so the first judging range is 1140 mA to 1144 mA, but not limited to the embodiment.

If the determining result of the step S130 is "YES", the power management method executes the step S140 including: updating the first steady current value with the second steady current value, wherein the second steady current value is the difference between the first steady current value and the first current variation parameter. It is noted that the second steady current value of the power management method is generated from the difference between the first steady current value and the first current variation parameter. In other words, the second steady current value is less than the first steady current value, and the power management method further utilizes the second steady current value to execute further comparison to the driving current or other current values.

In addition, the power management method executes the step S150 including: determining if the second steady current value is less than or equal to an energy saving set value. It is noted that the energy saving set value is a current value which the electronic device, after turning off at least one electronic module, operates with. As shown in FIG. 3, the method further executes a step S230 including: setting the sleeping operation current as the energy saving set value. It is noted that the current value which the electronic device, after turning off at least one electronic module, operates with is the sleeping operation current. For instance, in the embodiment, the energy saving set value is around 200 mA; the power management method executes the step S120 when the second steady current value is neither less than nor equal to the energy saving set value.

In addition, if the second steady current value is less than or equal to the energy saving set value, the power management method executes the step S160 including: activating an energy saving mode. In the process, the energy saving mode can be the sleep mode, but not limited to the embodiment. It is noted that the energy saving set value is a current value determining if the electronic device is operated at the sleep mode, and the power management method utilizes the relation between the second steady current value and the energy saving set value to determine if the electronic modules of the electronic device are at the idle status so as to determine if the electronic device can be performed into the sleep mode.

As shown in FIGS. 1 and 2, when the power management method determines that the second steady current value is neither less than or equal to the energy saving set value, executing the step S120. It is noted that the power management method has updated the first steady current value with the second steady current value in the step S140, so the first steady current value in the step S120 and the following steps needs to be replaced by the second steady current value, and the power management method continues to execute the following steps (e.g. S130-S150) until the second steady current value is less than or equal to the energy saving set value.

If the second steady current is larger than the energy saving set value, the power management method executes the step S120A including: turning off a second electronic module of the electronic device to decrease the driving current, wherein the second electronic module corresponds to a second current variation parameter. As illustrated above, the power management method prioritizes to turn off the electronic storage module, secondly turns off the electronic input/output module, and then turns off the electronic communication module, but not limited to the embodiment. In addition, the first electronic module (the electronic touch module) is turned off in the step S120, so the power management method can turn off the second electronic module (which can be the electronic audio module) in the following steps, but not limited to the embodiment.

The power management method, after the step S120A, executes the step S130 including: determining if the driving current is within a second judging range for a second period of time. It is noted that because the first steady current value is replaced by the second steady current value, the first judging range is replaced by the second judging range, wherein a maximum value of the second judging range is the sum of the second steady current value and the second current variation parameter, and a minimum value of the second judging range is the difference between the second steady current value and the second current variation parameter. For instance, the second steady current value, which is generated from the difference between the first steady current value and the first current variation parameter, is 1140 mA. In addition, the second current variation parameter corresponding to the second electronic module (the electronic audio module) is 3 mA, so the second judging range is 1137 mA to 1143 mA.

For instance, if the present driving current is 1138 mA and is within the second judging range (e.g. 1137 mA to 1143 mA), then the power management method executes the step S140 including: updating the second steady current value with a third steady current value, wherein the third steady current value is the difference between the second steady current value and the second current variation parameter. It is noted that the third steady current value of the power management method is generated from the difference between the second steady current value and the second current variation parameter. In other words, the third steady current value is less than the second steady current value, and the power management method further utilizes the third steady current value to execute further comparison to the driving current or other current values.

In practical applications, the third steady current value can be calculated from the difference between 1140 mA (the second steady current value) and 3 mA (the second current variation parameter) to obtain 1137 mA, but not limited to the embodiment.

The power management method, after the step S140, executes the step S150 including: determining if the third steady current value is less than or equal to the energy saving set value. It is noted that the energy saving set value is the current value which the electronic device, after turning off at least one electronic module, operates with. In addition, if the third steady current value is less than or equal to the energy saving set value, the power management method executes the step S160 including: activating an energy saving mode.

It is noted that the power management method executes the step S130 of FIG. 2; if the driving current is out of the first judging range or within the second judging range for the second period of time, the method executes a step S1300 including: determining if the driving current is larger than or equal to a sum of the initial current set value and the current variation parameter corresponding to the turned-off electronic module. In the process, the power management method determines if the driving current is larger than or equal to the sum of the initial current set value and the first current variation parameter of the first electronic module. It is noted that the power manage method determines if the electronic device drives at least one idle electronic module in real time by the step S1300 and the driving current is increased to exceed the sum of the initial current set value and the current variation parameter corresponding to the turned-off electronic module.

If the driving current is larger than or equal to the sum of the initial current set value and the current variation parameter corresponding to the turned-off electronic module, the power management method executes a step S1310 including: resetting the first steady current value to the initial current set value. In practical applications, if the driving current is larger than or equal to the sum of the initial current set value and the current variation parameter corresponding to the turned-off electronic module, it indicates that the electronic device does not fulfill the initial determination of the energy saving status and should terminate the energy saving mode and resets the corresponding steady current value. As shown in FIG. 1 or 2, the power management method should execute the step S100 again to read the driving current. It is noted that the first steady current value in the step S110 need to be replaced by the initial current set value. The initial current set value can be the bigger one between the prior-assembling operation current value and the post-assembling operation current value of the step S200 of FIG. 3 of the power management method.

In addition, after executing the step S1300, if the driving current is less than the sum of the initial current set value and the current variation parameter corresponding to the turned-off electronic module, the power management method executes the step S110 including: determining if the driving current is less than or equal to the first steady current value. The detailed illustration of the step S110 and other steps is illustrated above and not elaborated hereinafter.

It is noted that the present invention can combine the steps of FIGS. 2 and 3 to illustrate another embodiment. As shown in FIGS. 2 and 3, the power management method, after executing the step S230 of FIG. 3, can execute the step S100 of FIG. 2. In other words, the method detects the electronic modules of the electronic device and the current status thereof in advance to set the first steady current value, the initial current set value, and the energy saving set value, and further utilizes these values in the steps S100 through S160. Furthermore, the method has the efficiency of detecting system current and saving the power intelligently in the meantime.

In practical applications, when users use the electronic device, the power management method can utilize the steady current values, the initial current set value, the current variation parameters, and the energy saving set value that are preset to execute the energy saving process, also can utilize the steps S200 to S230 of FIG. 3 to detect the electronic modules to retrieve the set values above. In addition, when users stop using the electronic device, the driving current of the electronic device approaches to be steady, and the power management method continues to execute the steps S100 and S110 of FIG. 2 to read and compare the driving current, further determining whether to activate the energy saving mode.

In other words, take the flowchart of FIG. 2 for example; the power management method utilizes the step S110 to determine if the electronic device does not fulfill the initial determination of the energy saving status, further utilizing the step S120 to turn off the electronic module to decrease the driving current so as to save the power. If the determining result of the step S110 is "NO", the method repeats to execute the step S100 to read the driving current.

In addition, the power management method further utilizes the step S150 to compare the relative amplitude between the steady current value and the energy saving set value to determine if the electronic device can be driven to the energy saving mode (e.g. the sleep mode). It is noted that the flowchart of FIG. 2 further utilizes the step S1300 to compare the driving current with the larger limit of the first judging range to confirm if the electronic device is driving a certain electronic module. In other words, the larger limit of the first judging range is determined from the driving status of the electronic modules which is activated steadily or is at idle status. When the electronic device which is at the energy saving mode suddenly drives a certain electronic module and increases the driving current, the electronic device is not eligible for execution of steps S120-S160, but the step S100 or S110. Furthermore, the power management method of the present invention determines whether to enter an energy saving mode through the reading of driving current of the electronic device to achieve the intelligent power-saving effect.

Figure 4:
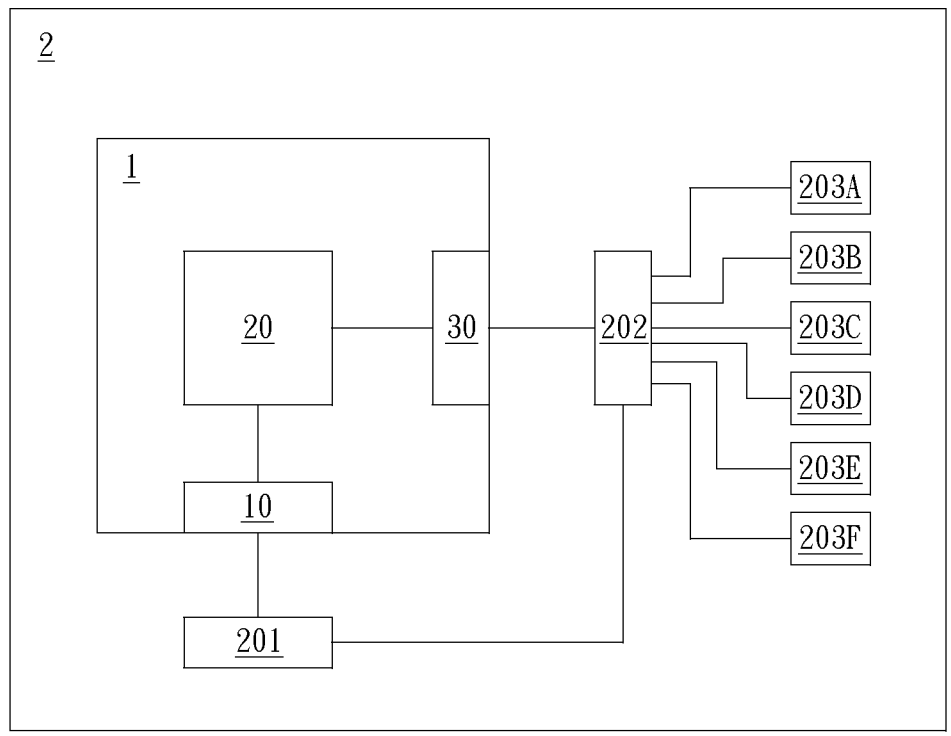
FIG. 4 is a schematic view of an embodiment of a power management system connecting an electronic device.

In addition, according to another embodiment, a power management system of the present invention is provided. The power management system is used for managing a power of an electronic device that has at least one electronic module and is operated with a driving current. Please refer to FIG. 4; FIG. 4 is a schematic view of an embodiment of a power management system connecting an electronic device. In the embodiment, the electronic modules have various sorts and can be electronic storage modules, electronic input/output modules, or electronic communication modules.

As shown in FIG. 4, the power management system 1 is embedded in the electronic device 2 and includes a detecting module 10, a comparison module 20, and a control module 30, wherein the detecting module 10 is connected with the electronic device 2 and reads the driving current. In the embodiment, the electronic device 2 includes a real-time current data interface 201, a micro process control interface 202, and a first electronic module 203A through a sixth electronic module 203F, but is not limited to the embodiment. In practical applications, the detecting module 10 is connected with the real-time current data interface 201, and the real-time current data interface 201 records the driving current of the electronic device 2, so that the detecting module 10 can read the driving current.

In addition, the comparison module 20 is connected with the detecting module 10 and stores a first steady current value and a first current variation parameter, and the first steady current value is the initial current set value, wherein the detecting module 10 transmits the driving current to the comparison module 20, and the comparison module 20 compares the driving current with the first steady current value and determines if the driving current is within a first judging range, and a maximum value of the first judging range is a sum of the first steady current value and the first current variation parameter, and a minimum value of the first judging range is a difference between the first steady current value and the first current variation parameter.

It is noted that the first steady current value is a current value when the first electronic module 203A through the sixth electronic module 203F are activated to be at the idle status. In addition, the first electronic module 203A through the sixth electronic module 203F respectively correspond to the current variation parameters, wherein the current variation parameter of each electronic module 203A through 203F can be the same or different; the amplitude of the current variation parameter is determined according to a current variation of each electronic module at idle status. In the embodiment, the current variation parameter of the first current module 203A is 2 mA, and the current variation parameter of the second electronic module 203B is 3 mA, but not limited to the embodiment.

In addition, the power management system 1 compares the relative amplitude between the driving current and the first steady current value for the first period of time, wherein the first period of time can be 3 minutes, but not limited to the embodiment. The comparison module 20 transmits an activation signal to the control module 30; the control module 30, according to the activation signal, drives the electronic device 2 to turn off the first electronic module 203A to decrease the driving current when the driving current is less than or equal to the first steady current value for 3 minutes, wherein the first electronic module 203A corresponds to the first current variation parameter. If the driving current is not less than or equal to the first steady current value for 3 minutes, the detecting module 10 reads the driving current again. In other words, the power management 1 utilizes the comparison between the first steady current value and the driving current to determine if the electronic modules 203A through 203F of the electronic device 2 are at the idle status so as to execute the command of energy saving.

In practical applications, the electronic modules are classified according to the functions; the electronic device 2 has at least one electronic storage module, at least one electronic input/output module, and at least one electronic communication module. It is noted that the power management system 1 sequentially turns off the electronic modules of the electronic device 2 in an order of the electronic storage module, the electronic input/output module, and the electronic communication module. In other words, the power management system 1 prioritizes to turn off the electronic storage module, secondly turns off the electronic input/output module, and then turns off the electronic communication module, but not limited to the embodiment.

As shown in FIG. 4, the control module 30 is connected with the detecting module 10 and the comparison module 20 and stores a power saving mode, wherein the comparison module 20 transmits the activation signal to the control module 30; the control module 30, according to the activation signal, drives the electronic device 2 to activate the power saving mode. In the embodiment, the control module 30 is connected with the micro process control interface 202 of the electronic device 2, wherein the micro process control interface 202 is connected with the electronic modules 203A through 203F and can control the driving status of the electronic modules 203A through 203F.

It is noted that the power management system 1 utilizes the first steady current value to determine whether to instruct the control module 30 to activate the power saving mode. In other words, the power management system 1, without utilizing hardware or other components to execute the determination of the power saving, merely utilizes the detecting module 10 to monitor the electricity variation of the electronic device 2 to determine if the electronic device 2 is eligible for activation of the power saving mode so as to increase the energy saving efficiency.

In practical applications, the driving current is 1141 mA, the first steady current value is 1142 mA, the driving current is less than the first steady current value, so that the power management system 1 activates the power saving mode. In addition, each electronic module corresponds to the current variation parameter, and the power management system 1 prioritizes to turn off the electronic module having less current variation parameter among the electronic modules in each function class. For instance, one class of the electronic modules is the electronic input/output module, and the electronic input/output modules include an electronic audio module and an electronic touch module, wherein the current variation parameters corresponding to the electronic audio module and the electronic touch module are respectively 3 mA and 2 mA, but not limited to the embodiment. In the embodiment, the power manage system 1 prioritizes to turn off the electronic touch module in this class to decrease the driving current.

For instance, the micro process control interface 202 of the electronic device 2 receives the activation signal of entering the power saving mode to turn off the first electronic module 203A of the electronic device 2 to decrease the driving current. In the embodiment, the power management system 1 utilizes the control module 30 to control the micro process control interface 202 and drives the electronic device 2 to turn off the first electronic module 203A so as to decrease the driving current. In practical applications, because the electronic touch module has less current variation parameter, the electronic device 2 turns off the electronic touch module to decrease the driving current. In other words, the power management system 1 utilizes the detecting module 10 to detect the current variation of the electronic device 2 and turns off the idle electronic module so as to save the power.

In addition, the comparison module 20 updates the first steady current value with a second steady current value when the comparison module 20 determines that the driving current is within the first judging range for a second period of time, wherein the second steady current value is a difference between the first steady current value and the first current variation parameter. It is noted that the maximum value of the first judging range is the sum of the first steady current value and the first current variation parameter, and the minimum value of the first judging range is the difference between the first steady current value and the first current variation parameter. In the embodiment, the first steady current value is 1142 mA and the first current variation parameter is 2 mA, so the first judging range is 1140 mA to 1144 mA, but not limited to the embodiment. In addition, the second steady current value of the comparison module 20 is generated from the difference between the first steady current value and the first current variation parameter. In other words, the second steady current value is less than the first steady current value, and the power management system 1 further utilizes the second steady current value to execute further comparison to the driving current or other current values. In practical applications, the second steady current value can be calculated from the difference between 1142 mA (the first steady current value) and 2 mA (the first current variation parameter) to obtain 1140 mA, but not limited to the embodiment.

It is noted that the comparison module 20 has an energy saving set value and compares the second steady current value with the energy saving set value, wherein the energy saving set value is a current value which the electronic device, after turning off the first electronic module 203A through the sixth electronic module 203F, operates with. In addition, the comparison module 20 sets a sleeping operation current value to the energy saving set value. It is noted that the sleeping operation current value is a lowest required current which the electronic device 2, after entering the sleep mode, drives the first electronic module 203A through the sixth electronic module 203F to be terminated with.

In addition, the comparison module 20 transmits an energy saving signal to the control module 30 to activate an energy saving mode of the electronic device 2 when the comparison module 20 determines the second steady current value is less than or equal to the energy saving set value. In the embodiment, the energy saving mode can be a sleeping mode, but not limited thereto. It is noted that the energy saving set value is a current value determining if the electronic device 2 is operated at the sleep mode, and the comparison module 20 compares the relation between the second steady current value and the energy saving set value to determine if the first electronic module 203A through the sixth electronic module 203F of the electronic device 2 are at the idle status so as to determine if the electronic device 2 can be performed into the sleep mode.

In the embodiment, the comparison module 20 transmits the activation signal to the control module 30; the control module 30, according to the activation signal, drives the electronic device 2 to turn off the second electronic module 203B to decrease the driving current when the comparison module 20 determines that the second steady current value is neither less than nor equal to the energy saving set value, wherein the second electronic module 203B corresponds to the second current variation parameter. As illustrated above, the power management system 1 prioritizes to turn off the electronic storage module, secondly turns off the electronic input/output module, and then turns off the electronic communication module, but not limited thereto. In addition, the first electronic module 203A (the electronic touch module) is turned off previously, so the control module 30 drives the electronic device 2 to turn off the second electronic module 203B (which can be the electronic audio module), but not limited to the embodiment.

In practical applications, the comparison module 20 determines if the driving current is within the second judging range for a second period of time. It is noted that because the power management system 1 has updated the first steady current value with the second steady current value, the first steady current value should be replaced by the second steady current value.

It is noted that the power management system 1 utilizes the comparison module 20 to determine the second judging range, wherein a maximum value of the second judging range is the sum of the second steady current value and the second current variation parameter, and a minimum value of the second judging range is the difference between the second steady current value and the second current variation parameter. For instance, the second steady current value is 1140 mA, and the second current variation parameter corresponding to the second electronic module 203B is 3 mA, so the second judging range is 1137 mA to 1143 mA.

If the comparison module 20 determines the driving current is not less than or equal to the second steady current value for 3 minutes, the detecting module 10 reads the driving current again. In other words, the power management system 1 utilizes the comparison module 20 to compare the second steady current value with the driving current, and further determines if the other electronic module 203C through 203F is at the idle status so as to determine whether to execute the command to save power.

In addition, the comparison module 20 determines if the driving current is within the second judging range, wherein the second judging range involves the second steady current value. If the comparison module 20 determines the driving current is within the second judging range, the comparison module 20 updates the second steady current value with the third steady current value. It is noted that the third steady current value of the power management method is generated from the difference between the second steady current value and the second current variation parameter. In other words, the third steady current value is less than the second steady current value, and the power management system 1 further utilizes the third steady current value to execute further comparison to the driving current or other current values.

In addition, the comparison module 20 determines if the third steady current value is less than or equal to the energy saving set value, wherein the energy saving set value is a current value which the electronic device, after turning off the first electronic module 203A through the sixth electronic module 203F, operates with. In addition, the comparison module 20 transmits the energy saving signal to the control module 30 and drives the control module 30 to control the electronic device 2 activating the energy saving mode if the comparison module 20 determines the third steady current value is less than or equal to the energy saving set value.

It is noted that the comparison module 20 determines if the driving current is larger than or equal to the sum of the initial current set value and the current variation parameter corresponding to the turned-off electronic module when the detecting module 10 detects that the driving current is out of the second judging range or the third judging range respectively for the second period of time. In the embodiment, the power management system 1 determines if the driving current is larger than or equal to the sum of the initial current set value and the first current variation parameter of the first electronic module 203A. It is noted that the power manage system 1 utilizes the comparison module 20 to determine if the electronic device 2 drives at least one idle electronic module in real time and the driving current is increased to exceed the sum of the initial current set value and the current variation parameter corresponding to the turned-off electronic module.

If the detecting module 10 detects the driving current is larger than or equal to the sum of the initial current set value and the current variation parameter corresponding to the turned-off electronic module, the comparison module 20 resets the second steady current value to the initial current set value. In practical applications, if the detecting module 10 detects the driving current is larger than the sum of the initial current set value and the current variation parameter corresponding to the turned-off electronic module, it indicates that the electronic device 2 does not fulfill the initial determination of the energy saving status, and the control module 20 transmits the termination signal to the electronic device 2 to terminate the power saving mode and resets the corresponding steady current value (e.g. the second steady current value, the third steady current value, or other steady current values). In practical applications, the detecting module 10 reads the driving current again, and the first steady current value is replaced by the initial current set value.

In practical applications, the power management system 1 is installed in the electronic device 2; when users use the electronic device 2, the power management method can utilize the steady current values, the initial current set value, the current variation parameters, and the energy saving set value that are preset to execute the energy saving process, also can utilize the detecting module 10 and the control module 30 connected with the electronic device 2 to detect the first electronic module 203A through the sixth electronic device 203F to retrieve the set values described above. In addition, when users stop using the electronic device 2, the driving current of the electronic device 2 approaches to be steady, and the power management system 1 continues to utilize the detecting module 10 to read and to utilize the comparison module 20 to compare with the driving current so as to determine whether to activate the energy saving mode.

In comparison with prior arts, the power management method and the power management system of the present invention utilize the first steady current value to determine whether to turn off the first electronic module. Furthermore, the power management method of the present invention determines if the electronic device is at idle status by reading the driving current of the electronic device, further determining whether to drive the electronic device into the energy saving status so as to save the power.

Although the preferred embodiments of present invention have been described herein, the above description is merely illustrative. The preferred embodiments disclosed will not limit the scope of the present invention. Further modification of the invention herein disclosed will occur to those skilled in the respective arts and all such modifications are deemed to be within the scope of the invention as defined by the appended claims.

What is claimed is:

1. A power management method for an electronic device operated with a driving current, the power management method comprising:
  (a) reading the driving current;
  (b) determining if the driving current is less than or equal to a first steady current value for a first period of time, wherein the first steady current value is an initial current set value;
  (c) turning off a first electronic module of the electronic device to decrease the driving current when the driving current is less than or equal to the first steady current value for the first period of time, wherein the first electronic module corresponds to a first current variation parameter;
  (d) determining if the driving current is within a first judging range for a second period of time, wherein a maximum value of the first judging range is a sum of the first steady current value and the first current variation parameter, and a minimum value of the first judging range is a difference between the first steady current value and the first current variation parameter;
  (e) updating the first steady current value with a second steady current value when the driving current is within the first judging range for the second period of time, wherein the second steady current value is a difference between the first steady current value and the first current variation parameter;
  (f) determining if the second steady current value is less than or equal to an energy saving set value; and
  (g) activating an energy saving mode when the second steady current value is less than or equal to the energy saving set value.

2. The power management method of claim 1, further comprising:
  turning off a second electronic module of the electronic device to decrease the driving current when the second steady current is larger than the energy saving set value, wherein the second electronic module corresponds to a second current variation parameter.

3. The power management method of claim 2, further comprising:
  determining if the driving current is within a second judging range for the second period of time, wherein a maximum value of the second judging range is a sum of the second steady current value and the second current variation parameter, and a minimum value of the second judging range is a difference between the second steady current value and the second current variation parameter.

4. The power management method of claim 1, after the step (d) further comprising:
  (d1) determining if the driving current is larger than or equal to a sum of the initial current set value and the first current variation parameter when the driving current is out of the first judging range for the second period of time.

5. The power management method of claim 4, further comprising:
  resetting the first steady current value by the initial current set value and executing the step (a) when the driving current is larger than or equal to the sum of the initial current set value and the first current variation parameter; and
  executing the step (b) when the driving current is less than the sum of the initial current set value and the first current variation parameter.

6. The power management method of claim 1, further comprising:
  defining a prior-assembling operation current value, a post-assembling operation current value, a sleeping operation current value, the initial current set value, and a current variation parameter corresponding to each electronic module;
  determining if the prior-assembling operation current value is larger than or equal to the post-assembling operation current value; and
  setting the sleeping operation current as the energy saving set value.

7. The power management method of claim 6, further comprising:
  setting the prior-assembling operation current value as the first steady current value when the prior-assembling operation current value is larger than or equal to the post-assembling operation current value; and
  setting the post-assembling operation current value as the first steady current value when the prior-assembling operation current value is less than the post-assembling operation current value.

8. A power management system for managing a power of an electronic device having at least one electronic module and operated with a driving current, the power management system comprising:
  a detecting module connected with the electronic device and reading the driving current;
  a comparison module connected with the detecting module and storing a first steady current value and a first current variation parameter, wherein the detecting module transmits the driving current to the comparison module, and the comparison module compares the driving current with the first steady current value and determines if the driving current is within a first judging range, and a maximum value of the first judging range is a sum of the first steady current value and the first current variation parameter, and a minimum value of the first judging range is a difference between the first steady current value and the first current variation parameter; and
  a control module connected with the detecting module and the comparison module, wherein the comparison module transmits an activation signal to the control module; the control module, according to the activation signal, drives the electronic device to turn off a first electronic module to decrease the driving current when the driving current is less than or equal to the first steady current value for a first period of time, wherein the first electronic module corresponds to the first current variation parameter.

9. The power management system of claim 8, wherein the comparison module updates the first steady current value with a second steady current value when the comparison module determines that the driving current is within the first judging range for a second period of time, wherein the second steady current value is a difference between the first steady current value and the first current variation parameter.

10. The power management system of claim 9, wherein the comparison module further has an energy saving set value and compares the second steady current value with the energy saving set value; the comparison module transmits an energy saving signal to the control module to activate an energy saving mode of the electronic device when the comparison module determines the second steady current value is less than or equal to the energy saving set value.

* * * * *